United States Patent
Shimanuki et al.

(10) Patent No.: US 7,336,892 B2
(45) Date of Patent: Feb. 26, 2008

(54) REFLECTION PLATE FOR SEMICONDUCTOR HEAT TREATMENT AND MANUFACTURING METHOD THEREOF

(75) Inventors: Kazuhiko Shimanuki, Yamagata (JP); Hiroyuki Honma, Yamagata (JP); Norihiko Saito, Yamagata (JP); Hideyuki Yokoyama, Yamagata (JP); Takanori Saito, Machida (JP); Ken Nakao, Sagamihara (JP)

(73) Assignees: Covalent Materials Corporation, Tokyo (JP); Tokyo Electron Limited, Tokyo (JP)

( * ) Notice: Subject to any disclaimer, the term of this patent is extended or adjusted under 35 U.S.C. 154(b) by 1243 days.

(21) Appl. No.: 10/391,583

(22) Filed: Mar. 20, 2003

(65) Prior Publication Data

US 2003/0184696 A1   Oct. 2, 2003

(30) Foreign Application Priority Data

Mar. 29, 2002   (JP)   ............................. 2002-094545

(51) Int. Cl.
*F21V 7/00* (2006.01)
*G02F 1/1335* (2006.01)

(52) U.S. Cl. ...................... 392/420; 392/422; 392/423; 392/435; 219/544; 219/545; 219/548; 219/549; 219/528; 219/553; 338/268; 338/212; 338/252; 338/311; 349/113

(58) Field of Classification Search ............ 219/544–5, 219/548–9, 528, 553, 460.1, 462.1, 468.1, 219/468.2; 338/268, 212, 214, 252, 311; 392/420, 422–3, 435; 349/113; 118/725; 423/447.1–447.2, 445 R
See application file for complete search history.

(56) References Cited

U.S. PATENT DOCUMENTS

| | | | |
|---|---|---|---|
| 5,868,850 A | 2/1999 | Ichishima et al. | |
| 6,087,632 A | 7/2000 | Mizosaki | |

FOREIGN PATENT DOCUMENTS

| | | |
|---|---|---|
| JP | 58-171815 A | 10/1983 |
| JP | 9-063973 | 3/1997 |
| JP | 2000-21890 A | 1/2000 |
| JP | 2000-150396 A | 5/2000 |
| JP | 2002-006125 | 1/2002 |
| WO | WO 99/02757 A1 | 1/1999 |

OTHER PUBLICATIONS

Surface roughness—Definitions and designation, Japanese Industrial Standard, Jan. 6, 1994, JIS B 0601-1994, pp. 1-25, Edition 7, Japanese Standards Association, Japan.

*Primary Examiner*—Shawntina Fuqua
(74) *Attorney, Agent, or Firm*—Foley & Lardner LLP

(57) ABSTRACT

It is provided that a reflection plate of semiconductor heat treatment, which is resistant to cracks or deformations by controlling the adsorption of foreign materials and the production of reaction. Said reflection plate 1 for semiconductor heat treatment is composed of a disk-shaped or ring-shaped plate of optically transmissible material and a plate 2 of inorganic material hermetically enclosed in said disk-shaped or ring-shaped plate, in which said plate of inorganic material has at least one side in contact with said plate of optically transmissible material, said at least one side 2a having a surface roughness of Ra 0.1 to 10.0 μm, said at least one side 2a formed grooves 2c therein.

18 Claims, 5 Drawing Sheets

REFLECTION PLATE FOR SEMICONDUCTOR HEAT TREATMENT AND MANUFACTURING METHOD THEREOF

BACKGROUND OF THE INVENTION

1. Field of the Invention

The present invention relates to a reflection plate for semiconductor heat treatment and more particularly to a plate for a heater to be used for semiconductor heat treatment, a reflection plate to be used for a semiconductor heat treatment reactor, or a reflection plate to be placed on a wafer board for heat treating semiconductors such as dummy wafers.

2. Description of the Related Art

In the field of semiconductor manufacturing, reflection plates of various shapes and sizes are used for reflecting heat radiating from a heating element. More specifically, reflection plates of heaters for semiconductor heat treatment, reflection plates to be used for a semiconductor heat treatment reactor, or dummy wafers to be plate on a board may be exemplified.

Such reflection plates must meet requirements such as absence of dust, corpuscles, or particles which might be resulted therefrom; sufficient corrosion resistance because ambient gases are highly corrosive in many cases.

As a solution to satisfy the above requirements, the applicant proposed a reflection plate of the heater to be used in the semiconductor heat treatment in Japanese Patent Application Laid Open to the Public No. 2000-21890, referring to which an explanation will be given as follows with reference to FIGS. 8 and 9.

In FIG. 8, a reflection plate 20 is composed of a plate-like quartz glass support member 21 and a reflection plate 22 of carbon having at least one mirror side, said reflection plate 22 being sealed in the plate-like quartz support member 21.

Said reflection plate 20 has been assembled by putting together a quartz glass upper plate portion 21a, said reflection plate 22 having at least one mirror side, and a quartz glass lower plate portion 21b having a countersunk seat 21c (recess) for the reflection plate, all of said elements being subjected to fusion treatment after the assembly work as shown in FIG. 9 such that said quartz glass upper plate portion 21a and said quartz glass lower portion 21b of the quartz glass support member are made integral.

With said reflection plate 20, the carbonaceous reflection plate 22 covered in said quartz glass support member 21 provides protection against the production of dust, corpuscles, particles, or the like as well as providing sufficient corrosion resistance.

It is to be noted here that said reflection plate for semiconductor heat treatment are used in the reactor environment under a temperature of 200 to 1200° C.

For this reason, a technical problem still remains that said carbonaceous reflection plate reacts with the ambient gas within the interior space defined by the countersunk seat 21c (recess) for the reflection plate or with the quartz glass to result in foreign material adsorption as a result of such reaction therewithin.

Furthermore, the reaction gas produced by the carbonaceous reflection plate or the quartz glass cause a rise of local gas pressure between the carbonaceous reflection plate and the quartz glass body in contact therewith with the result that said quartz glass body tends to crack or deform.

Furthermore, it is to be noted that said quartz glass reflection plate 22 is accommodated in said quartz glass lower portion 21b having a countersunk seat 21c (recess) before the quartz glass upper portion 21a is placed thereon so as to cover the countersunk seat 21c (recess), the weight of said quartz glass upper portion 21a being applied thereonto at a temperature of as high as 1,200° C. or more to be subjected to the fusion treatment.

At this time, there is a likelihood that the interspatial gas produced by moisture adsorbed on the carbonaceous reflection plate, residual gas or a gas in the space defined by the countersunk seat 21c (recess) for the reflection plate can expand while the quartz glass body defining the sealed space can expand, deform or fracture.

SUMMARY OF THE INVENTION

The present invention has been made to solve the above mentioned technical problem and its object is to provide a reflection plate for semiconductor heat treatment which is resistant to cracks or deformations by controlling the production the adsorption of foreign materials and the production of reaction gases.

Further, it is another object of the invention to provide a method of manufacturing a reflection plate for semiconductor heat treatment which is capable of obtaining a high precision reflection plate for semiconductor heat treatment plate without any influence at the time of production from moisture adsorbed on the reflection plate, residual gases, or any atmosphere within the accommodation space.

The reflection plate for semiconductor heat treatment according to the present invention made to solve the above mentioned technical problems is characterized in comprising a disk-shaped or ring-shaped plate of optically transmissible material; and a plate of inorganic material hermetically enclosed in said disk-shaped or ring-shaped plate, said plate of inorganic material having at least one surface in contact with said plate of optically transmissible material, said at least one surface having a surface roughness of Ra 0.1 to 10.0 μm, said at least one surface having grooves formed therein.

Since the surface roughness of said plate of inorganic material kept in contact with said optically transmissible material is kept at Ra 0.1 to 10.0 μm, it is possible to restrain the reaction as a result of contact between said plate and plate.

Further, because of grooves formed in one surface of the plate of inorganic material, the local temperature rise due to the reaction gas production between the plate of inorganic material and the plate of optically transmissible material such that the local gas pressure rise due to the said reaction gas production is restrained to prevent cracks in or deformation of said plate of optically transmissible material from being taking place.

It is preferred here that both the plate of optically transmissible material and the plate of inorganic material are ring-shaped while the grooves formed in the plate of inorganic material are including grooves linearly and continuously extending from the inner periphery to the outer periphery thereof.

In this way, since the grooves are formed in the plate of inorganic material extending linearly and continuously from the inner periphery to the outer periphery, the local gas pressure rise due to the production of said reaction gas, the cracks in and deformation of the plate of optically transmissible material is restrained.

Particularly, since the grooves extend from the inner periphery to the outer periphery, the reaction gas is vented in the direction of inner and outer periphery to assure that the local gas pressure rise is restrained to prevent the production of cracks in and the deformation of the plate of optically transmissible material.

Further, since the plate of optically transmissible material and the plate of inorganic material are both disk-shaped, it is preferable that the grooves formed in the plate of inorganic material extends linearly and continuously from one outer periphery to another outer periphery opposite said one outer periphery.

In this way, the plate of optically transmissible material and the plate of inorganic material may be disk-shaped such that the local gas pressure rise due to the production of said reaction gas is restrained as in the case of said plate of inorganic material being ring-shaped with the result that the production of cracks in and the deformation of said plate of optically transmissible material is restrained.

In this case, it is preferred that the grooves formed in the plate of inorganic material is extending centrally thereof such that the local gas pressure centrally produced therein is restrained to restrain the production of cracks in and the deformation of the plate of optically transmissible material.

Further, it is preferable that one or a plurality of grooves is concentrically formed in said plate of inorganic material.

In this way, since one or a plurality of grooves are concentrically formed in the plate of inorganic material, the reaction gas can be vented in the circumferential direction such that the local air pressure rise is prevented to preferably restrain the formation of cracks in and the deformation of the plate of optically transmissible material.

It is preferred that the surface of said plate is substantially equally divided by the grooves formed in said plate of inorganic material.

In this way, since the surface of said plate is substantially divided by said grooves, it is assured that the local air pressure rise at the plate for the most part is controlled to restrain the production of cracks in and the deformation of the plate of optically transmissible material.

Further, it is preferred that the plate of inorganic material is hermetically enclosed within the plate of optically transmissible material, which has an inside pressure is reduced down to 200 torr or less.

In this way, since the inside pressure of said plate of optically transmissible material is reduced down to 200 torr or less, it is possible to restrain a high temperature reaction of said plate of optically transmissible material and the plate of inorganic material within the inside space of said plate of inorganic material and said plate of optically transmissible material.

Further, the reduced inside pressure assures that said optically transmissible material hermetically enclosing the plate of inorganic material is free from any expansion deformation and damage thereto.

Further, it is possible to effectively discharge moisture adsorbed on the plate of inorganic plate, the residual gas therein, the ambient gas within the inside thereof due to said structure incorporated during the manufacturing process of the plate of inorganic material.

Further, it is preferable that said plate of inorganic material is bored with a hole in the direction of thickness thereof at a position where the grooves formed in said plate intersect each other.

The hole bored in the direction of thickness at a position where the grooves intersect each other functions to assure the effective discharge of the ambient gases within the inside of the plate of inorganic material including moisture adsorbed onto the plate, the residual gases or the ambient gases within the inside of said plate of optically transmissible material.

Further, it is preferable that said hole is provided centrally of the plate of inorganic material.

It is noted that the inside space centrally between the upper side and the lower side in the plate of optically transmissible material is most susceptible to pressure differential.

As described in the foregoing, said pressure differential can be minimized at the time of production and use if the plate of inorganic material is centrally formed with a hole therein to prevent the formation of said plate of optically transmissible material.

If the total lengths of the grooves formed in the plate of inorganic material is less than one time the outer periphery of the plate, the local pressure rise can be a cause of deformation thereof and cracks therein whereas if it exceeds 10 time, deficiency of its strength and decreased reflection performance can result. Therefore, it is preferable that the total groove length is 1 to 10 times the outer periphery of said plate.

Further, the method of manufacturing the reflection plate for semiconductor heat treatment practice in order to solve the above mentioned technical problem comprises the steps of preparing a first plate member of optically transmissible material with a recess for accommodating a plate of inorganic material having a surface formed with grooves; forming a gas vent in the floor of said recess; accommodating said plate of inorganic material in said recess such that said surface formed with grooves is in contact with the floor of said recess before covering said recess by means of a second member of optically transmissible material; discharging ambient gases within the recess by way of the gas vent while the first plate member and the second plate member are subjected to fusion treatment to each other at a temperature of 1200° C. or higher; and closing said gas vent after the fusion treatment.

The effective discharge during the manufacturing process of moisture adsorbed onto the plate of inorganic material, the residual gases, the ambient gas inside the plate of optically transmissible material thanks to this manufacturing method assures the provision of the reflection plate for semiconductor heat treatment of high precision.

The reflection plate for semiconductor heat treatment according to the present invention made to solve the above technical problem is characterized in comprising a disk-shaped or ring-shaped plate of optically transmissible material; and a plate of inorganic material hermetically enclosed in said disk-shaped or ring-shaped plate, said plate of inorganic material having at least one surface in contact with said plate of optically transmissible material, said at least one surface having a surface roughness of Ra 0.1 to 10.0 µm, said at least one surface having grooves formed therein.

In this way, also with grooves formed in at least one surface of the plate of optically transmissible material in contact with said plate of inorganic material, it is possible to restrain the reaction due to the contact between the plate and plate as in the case of reflection plate for semiconductor heat treatment as mentioned in the foregoing. As a result, the production of adsorption of foreign materials onto the inner surface of the optically transmissible material, the production of reaction gases can be restrained.

Further, the formation of grooves in one surface of the plate of optically transmissible material helps restrain the local air pressure rise accompanying the gas production between the plate of inorganic material and the plate of optically transmissible material because there are grooves in one surface of the plate of optically transmissible material. As a result, cracks in and deformation of the plate of optically transmissible material are restrained.

It is to be noted that both the plate of optically transmissible material and the plate of inorganic material are ring-shaped, in which there is provided fusion surfaces in the inner periphery and the outer periphery of the plate of optically transmissible material and it is preferable that said grooves formed in said plates include grooves extending linearly and continuously to said fusion surface at the inner and outer peripheries.

Further, it is preferable that both the plate of optically transmissible material and the plate of inorganic material are disk-shaped, in which there is provided a fusion surface in the inner periphery and the outer periphery of the plate of optically transmissible material and it is preferable that the grooves formed in said plate extend linearly and continuously from the fusion surface in one outer periphery to the fusion surface of another outer periphery opposite said one outer periphery.

In this way, the local air pressure rise accompanying the production of said reaction gas is restrained because the grooves formed in the plate of optically transmissible material extend linearly and continuously from the fusion surface of one inner periphery to the fusion surface of another outer periphery. As a result, the local air pressure rise accompanying the production of said reaction gases is restrained to control the cracks in and the deformations of the plate of optically transmissible material is restrained.

BRIEF DESCRIPTION OF THE DRAWINGS

FIG. 5A and FIG. 5B are plan views showing modifications of grooves formed in the plate of inorganic material, in which FIG. 5A depicts the one modification provided with only con-centric grooves whereas FIG. 5B depicts another modification provided with linear grooves 2c extending from the inner periphery and outer periphery thereof;

DESCRIPTION OF THE PREFERRED EMBODIMENTS

Hereinafter, the reflection plate for semiconductor heat treatment according to the present invention and the method of manufacturing said reflection plate for semiconductor heat treatment will be explained with reference to FIG. 1 through FIG. 4.

Figure 1:
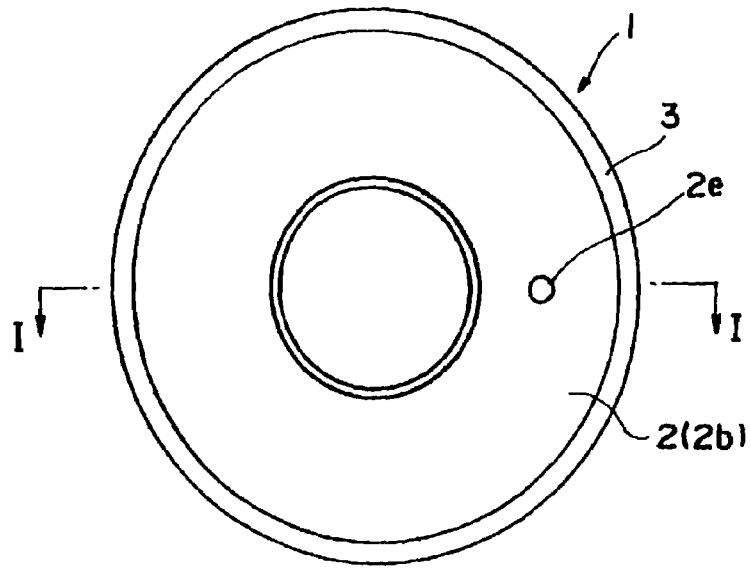
FIG. 1 is a plan view of one embodiment of the reflection plate for semiconductor heat treatment in plan view according to the present invention.
Figure 2:
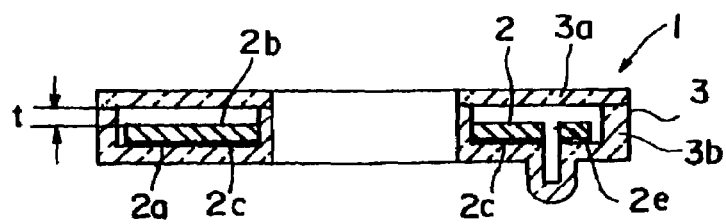
FIG. 2 is a sectional view of FIG. 1 taken along the line I-I.

As shown in FIG. 1, the reflection plate 1 for semiconductor heat treatment is composed of a plate 2 of inorganic material, said plate 2 having at least one glossy side having a reflection ratio of 30% or a mirror surface having a reflection ratio of 80% or more in the light having a wave length of 500 through 2000 nm; and a plate 3 of optically transmissible sealing said plate 2 therewithin.

For such plate 2 of inorganic material, ceramic materials including carbon, SiC, TiN or the like, or metallic materials including Au, Pt or the like may be used; in view of heat resistance, purity requirement and cost performance, thermally expansible graphite is particularly preferable.

The surface roughness of the side 2a of the plate 2 made of inorganic material in contact with said plate 3 is Ra 0.1 to 10.0 µm.

In this way, since the surface roughness of the side 2a of the plate 2 is in the range of Ra 0.1 to 10.0 µm, the side 2a of the plate 2 is not in complete contact with the plate 3 of said optically transmissible material.

Therefore, even if the reflection plate for semiconductor heat treatment is used within the semiconductor heat reactor at a temperature of 200 through 1200° C., it is possible to control the reaction between said plate 3 and the plate 2 such that the production of foreign materials and the generation of reaction gases are restrained.

Particularly, with Ra less than 0.1 µm, the complete contact can result to initiate reaction whereas, with Ra being more than 10.0 µm, protruding portions in the irregularity.

It is to be noted that said surface roughness Ra is a arithmetic mean roughness defined by JIS B0601-1994, which was measured by means of an ordinary surface roughness measuring instrument (such as Mitutoyo make SURFTEST SJ-201) under a set condition of the cutoff value=0.8 mm and the number of sections=5 (measured length=4 mm).

Further, it is to be noted that the plate 2 of inorganic material and the plate 3 of optically transmissible material are each in the form of a ring.

Figure 3:
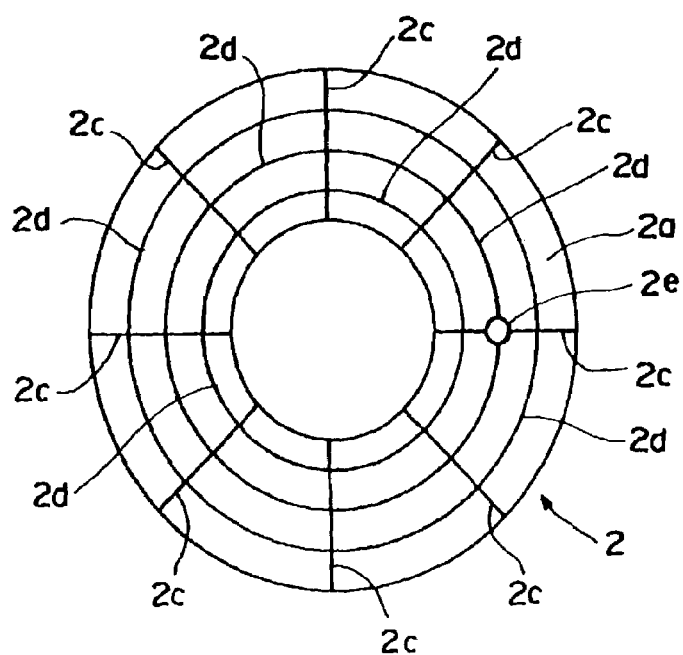
FIG. 3 is a plan view showing the grooved surface of the plate of inorganic material shown in FIG. 1.

Further, the side 2a of said plate 2 is formed with a plurality of linear grooves 2c continuously extending from the inner periphery to the outer periphery with predetermined intervals. In FIG. 3, eight grooves 2c are formed therein with angular distances of 45°.

The side 2a of said plate 2 is formed with three concentric grooves 2d and a hole 2e is bored through said plate 2 in the direction of thickness at a position where one of said grooves 2c crosses one of said grooves 2d.

Further, the other side 2b of said plate 2 is mirror-surfaced. With the thus mirror surfaced side 2b, it is possible to have either one of said sides 2a and 2b of better quality.

Next, the plate 3 made of optically transmissible material will be explained.

Figure 4:
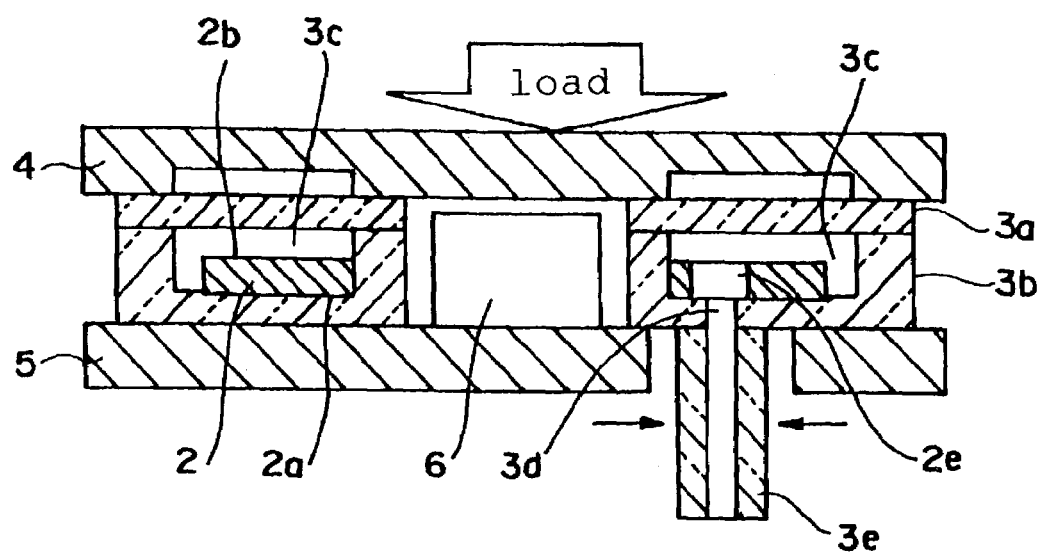
FIG. 4 is a sectional view for explaining the manufacturing method of the reflection plate for semiconductor heat treatment.

Said plate 3 made of optically transmissible material is composed of said upper plate portion 3a of a quartz glass ring as shown in FIG. 4 and a lower plate portion 3b of a quartz glass ring, said lower plate portion 3b having the recess 3c to accommodate the plate 2 of a inorganic material therein, said quartz glass upper plate portion 3a and said quartz glass lower plate portion 3b being subjected to fusion treatment for integration.

Further, said quartz glass lower plate portion 3b is formed with a gas vent 3d therein, said quartz glass lower plate portion 3b being further formed of a quartz glass gas exhaust pipe 3e at an outside of said quartz glass plate 3b in communication with said gas vent 3d.

Said gas exhaust pipe 3e is adapted to discharge moisture adsorbed onto the plate 2 of inorganic material, residual gases and ambient gases within the recess 3c (an inside space) to produce a reduced pressure (down to 200 torr or less), said pipe being closed after such discharge.

The members composing the plate 3 of optically transmissible material referred to as quartz glass hereinbefore may be replaced with an optically transmissible alumina. In a viewpoint of purity, heat resistance and workability, however, quartz glass is most preferable.

As in the foregoing, the reflection plate 1 for semiconductor heat treatment is manufactured by accommodating the plate 2 of inorganic material with the side 2a thereof being in contact with the floor of the recess 3c in said quartz glass lower plate portion 3b and subjecting the quartz glass upper plate portion 3a and the quartz glass lower portion 3b to fusion treatment for integration. It is to be noted that the inside of the recess 3c with the plate 2 accommodated therein is set to a reduced pressure (down to 200 torr or less).

Therefore, even if used in the intra-reactor atmosphere of 200 to 1200° C., said plate functions to control reaction between said plate 3 and said plate 2 to minimize the production of foreign materials and reaction gases because the surface roughness of the surface 2a of the plate 2 is Ra 0.1 to 10.0 μm.

Further, the reaction gases are vented in radial (inwardly or outwardly) and circumferential directions to restrain a local air pressure rise accompanying the reaction gas production because the plate 2 of inorganic material is formed with the linear grooves 2c extending from the inner periphery to the outer periphery and a plurality of concentric grooves 2d. As a result, the formation of cracks in or the deformation of the plate of optically transmissible material is restrained.

Further, the pressure in the inside space of said plate 3 of optically transmissible material is reduced down to 200 torr such that a high temperature reaction between the plate 2 of inorganic material and the plate 3 of optically transmissible material are controlled. Even if a reaction gas should be produced, the plate 3 of optically transmissible material is prevented from expanding, deforming or being damaged.

Further, the existence of the hole 2e bored in the direction of thickness through the plate 2 of inorganic material can prevent the plate 3 of optically transmissible material from deforming otherwise from pressure differential in the space above and below said plate 2 of inorganic material. Particularly, the hole 2e provided at the position where the grooves 2c intersects the grooves 2d such that the deformation of the plate 3 due to pressure differential in the spaces above and below the plate 2 of inorganic material is prevented even at the time of manufacturing and use.

Next, the method of manufacturing the reflection plate for semiconductor heat treatment will be explained with reference to FIG. 4.

First, the quartz glass lower plate portion 3b of optically transmissible material is formed with a countersunk seat 3c to accommodate the plate 2 of inorganic material and a gas vent 3d bored in the floor of said seat 3c. Further, the outside of said quartz glass lower plate portion 3b is formed with a gas exhaust pipe 3e in communication with said gas vent 3d.

Further, said plate 2 of inorganic material is processed to have a predetermined surface roughness and is formed with grooves 2c and grooves 2d therein.

Then, the plate 2 is accommodated in the recess 3c such that the side 2a of the plate 2 of inorganic material is brought into contact with the floor in the recess. Thereafter, the recess 3c is covered by the quartz glass upper plate member 3a such that said quartz glass upper glass member 3a and the quartz glass lower plate member 3b are applied with a load by a mold 4 while being subjected to fusion treatment at a temperature of 1200° C. or higher.

At this time, ambient gases inside the recess 3c, moisture adsorbed onto the plate 2, residual gases or the like are discharged by way of the gas vent 3d such that the inside pressure is eventually reduced down to 200 torr or less.

Thereafter, said gas vent 3d is closed such that the plate 2 is sealed within the plate 3. In FIG. 4, in this connection, the numeral 5 denotes a base and the numeral 6 is a stop to restrain a downward movement of said mold 4.

This method of manufacturing assures that the moisture adsorbed onto the plate 2 of inorganic material, the residual gases, the ambient gases in the inside of the plate 3 are discharged effectively to obtain a reflection plate for semiconductor heat treatment of high precision.

Particularly, the formation of the grooves 2c, 2d and the hole 2e prevents the plate 3 of optically transmissible material from being deformed as a result of the pressure differential between the spaces above and below the plate 2 of inorganic material even at the time of manufacture. Further, it is also ensured that a local pressure rise accompanying the generation of the reaction gas is controlled while cracks in and deformation of the plate 3 of optically transmissible material is controlled.

Figure 5A:
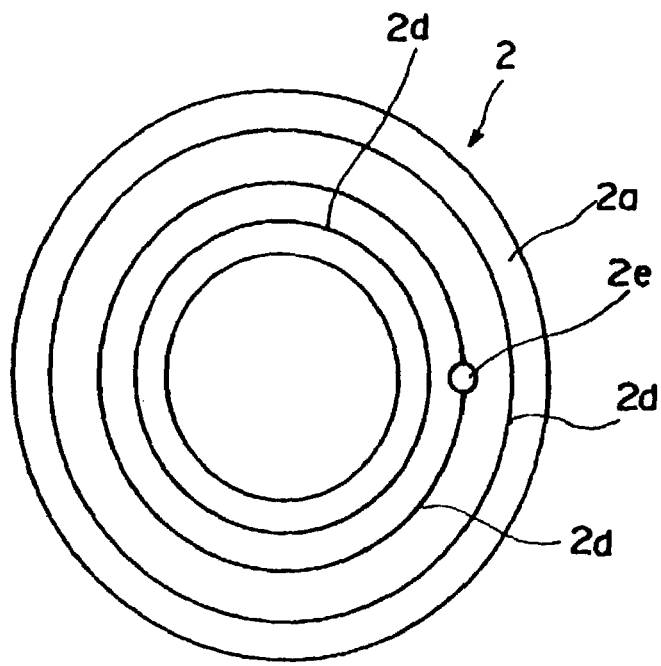
Figure 5B:
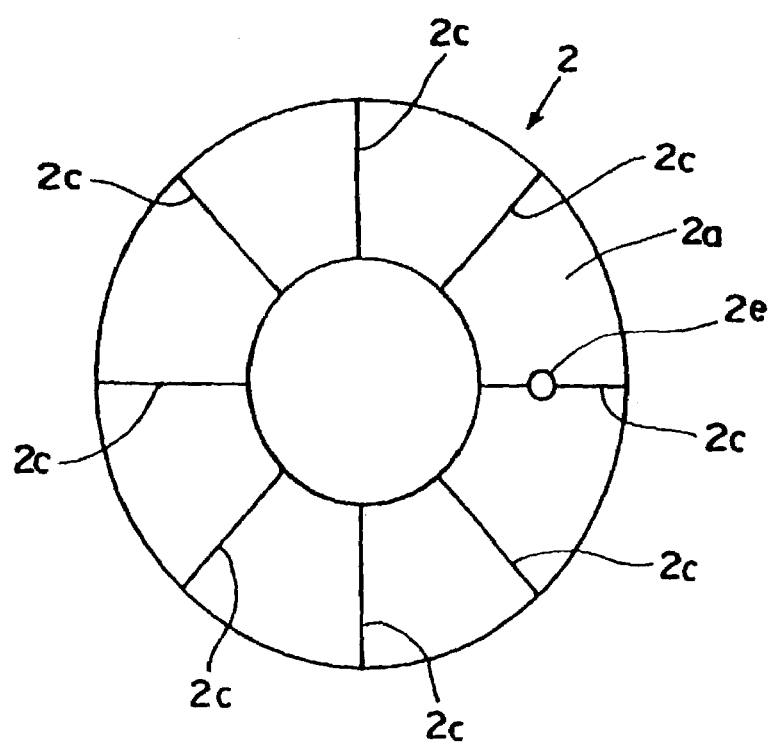

In the above embodiment, the plate 2 of inorganic material is shown as having the linear grooves 2c continuously extending from the inner periphery to the outer periphery and the concentric grooves though not limited thereto but concentric grooves 2d alone as shown in FIG. 5A or linear grooves 2c continuously extending from the inner periphery to the outer periphery alone as shown in FIG. 5B may be substituted therefor.

Figure 6:
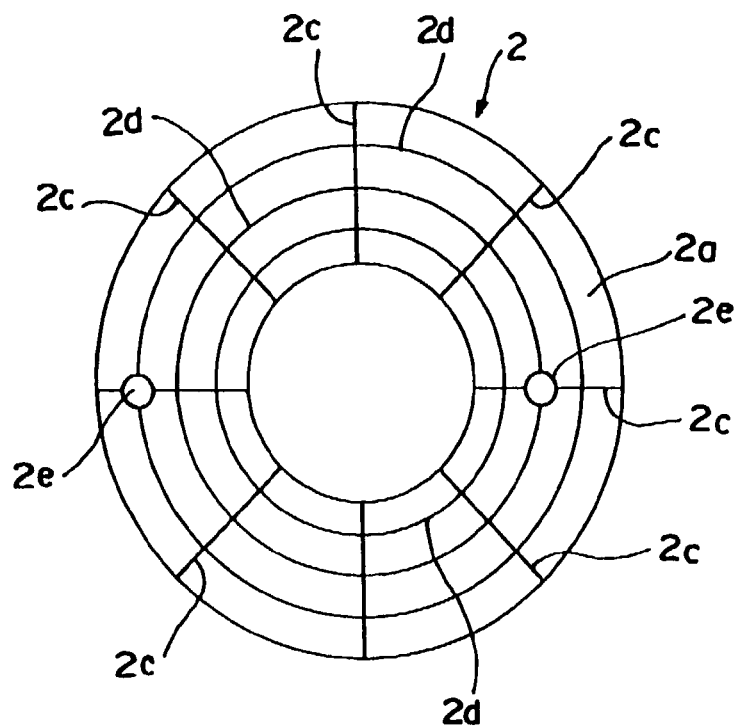
FIG. 6 is a plan view of a modification provided with holes bored in the plate of inorganic material.

Further although the above embodiment shows the sole hole 2e bored in the plate 2 of inorganic in the direction of thickness thereof though not particularly limited thereto but a plurality of holes 2e may be formed as shown in FIG. 6.

Figure 7:
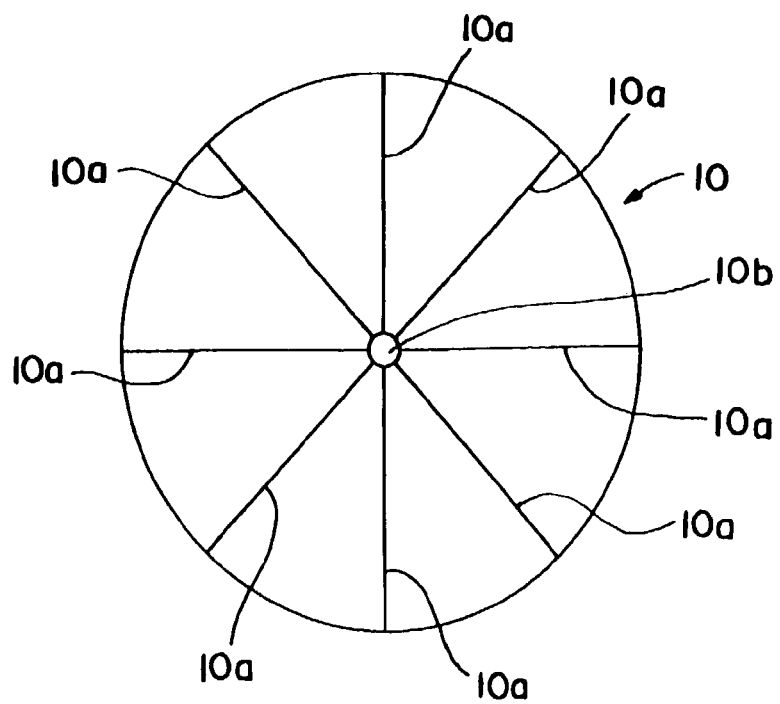
FIG. 7 is a plan view depicting a modification of the plate of inorganic material.
Figure 8:
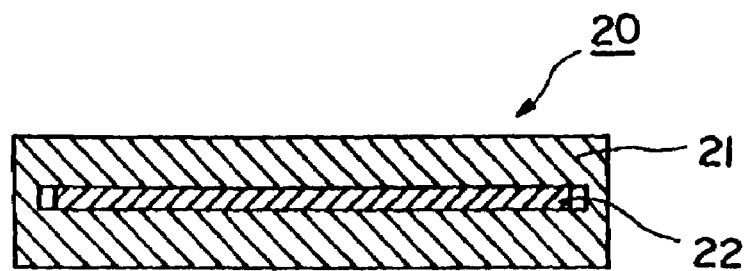
FIG. 8 is a sectional view of a reflection plate for semiconductor heat treatment according to the prior art.
Figure 9:
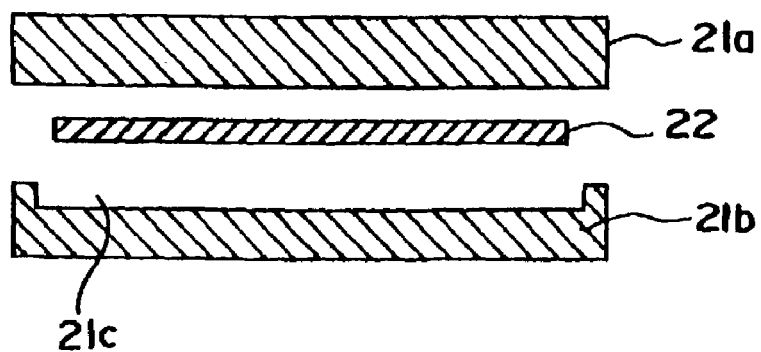
FIG. 9 is a sectional view for explaining a production method of the reflection plate for semiconductor heat treatment according to the prior art.

Further, the ring-shaped plate of inorganic material is explained as being sealed within the ring-shaped plate of optically transmissible material though not particularly limited to the ring-shaped plate but a disk plate 10 of inorganic material as shown in FIG. 7 may be hermetically sealed in the plate of optically transmissible material.

Further, in the case of the plate 10 of inorganic material being a disk, a plurality of linear grooves 10a are preferably formed in the plate 10 to extend continuously from one outer periphery thereof to another outer periphery opposite said one outer periphery.

Said grooves 10a terminate at the center of said plate 10, where a hole 10b is bored in the plate 10.

When ambient gases in the inside of said plate of optically transmissible material is discharged, the pressure differential is most likely to be generated most between an upper side space and a lower side space at the center of the plate 10.

However, the existence of the hole 10b at the center of the plate 10 helps reduce the pressure differential to prevent any deformation of the plate 10 of optically transmissible material.

Further, the grooves 10a formed in the plate 10 define the surface of the plate substantially in equally divided sections (especially in the circumferential directions). With the sections being thus equally divided, it is ensured that a local air pressure rise is controlled, as well as the formation of cracks in or the deformation of the plate of optically transmissible material.

It is to be noted that one or a plurality of concentric grooves may be formed in the embodiment shown in FIG. 7.

Further, although the formation of grooves in the plate of inorganic material was explained in the above embodiment, such grooves may be formed in the plate of optically transmissible material.

In other words, in the reflection plate for semiconductor heat treatment composed of a disk or ring-shaped plate of optically transmissible material and a plate of inorganic material hermetically enclosed in said plate of optically transmissible material, the surface roughness of at least one side of the plate of inorganic material in contact with the plate of optically transmissible material may be Ra 0.1 to 10.0 µm, the same effects as the above mentioned embodiments can be obtained even if grooves are formed in at least the whole surface of the optically transmissible plate in contact with the plate of inorganic material.

Further, even in case where such grooves are formed in the plate of optically transmissible material, it is preferable that said plate of optically transmissible plate and said plate of inorganic material are in the form of rings, the inner and outer peripheries of the plate of optically transmissible material have fused surfaces and said grooves formed in the plate are in the form of those linearly and continuously extending from the fused surfaces in the inner periphery to the outer periphery.

Further, it is preferable that said plate of optically transmissible material and said plate of inorganic material are both in the form of disks, the outer periphery of the plate of optically transmissible material have a fused surface, and said grooves formed in the plate are in the form of those linearly and continuously extending from the fused surface in one outer periphery to the fused surface in another outer periphery opposite said one outer periphery.

In this way, a local air pressure rise accompanying the generation of said reaction gases is controlled to prevent the cracks in and the deformation of the plate from resulting because said plate of optically transmissible material is formed with grooves continuously and linearly extending from the fusing surface of the inner periphery to the fusing surface of the outer periphery or formed with grooves linearly and continuously extending from the fusing surface in one outer periphery to the fusing surface of another outer periphery opposite said one outer periphery.

EXAMPLE 1

The plate 2 was formed of inorganic material such as a thermally expansive graphite sheet having an outer diameter φ of 316 mm, an inner diameter φ of 103 mm, a thickness of 550 µm and a surface roughness (Ra) of 1.0 µm of one surface (a surface in contact with the plate of optically transmissible material).

Further, such surface was formed with eight grooves 2c of 0.1 mm both in width and thickness and three grooves 2d of 0.1 mm in width and thickness as shown in FIG. 3. Further, a hole 2e having a diameter of 5 mm was bored at a position shown in FIG. 3.

Further, the material of the plate 3 was an optically transmissible material such as quartz glass and in order to assemble such plate, a lower plate portion 3b having an outer diameter of 326 mm and an inner diameter of 93 mm which was formed with a recess 3c having a depth of 0.6 mm and an upper plate portion 3a having an outer diameter of 326 mm, an inner diameter of 93 mm and a thickness of 2 mm are prepared.

It is to be noted that the floor of the recess 3c in the lower plate portion 3b was formed with a hole having a diameter of 4 mm to provide a gas vent 3d. Further, a gas exhaust pipe 3e was fused to said gas vent 3d to be connected to the outside face of the lower quartz glass portion 3b.

Then, the plate 2 was accommodated in the recess 3c of the plate 2 such that the side 2a of the plate 2 is brought into contact with the floor surface of the recess 3c. Thereafter, the recess 3c was covered with the quartz glass upper portion 3a before a load of 50 kg is exerted onto the quartz glass upper portion 3a and the quartz glass lower portion 3b by means of a mold 4 as shown in FIG. 4 while gas discharge and fusion treatment were being performed at a temperature of 1,200° C. or higher.

Then, after the inside pressure of the recess 3c was reduced eventually down to 200 torr or less, the gas vent 3e was closed such that the plate 2 was hermetically enclosed within the plate 3.

As a result, said plate 3 of optically transmissible material was found free from deformation, production of cracks therein, a reflection plate of highly precise size for semiconductor heat treatment was obtained.

Said reflection plate for semiconductor heat treatment was used for 300 hours at a temperature of 1200° C. to find that there was no deformation of said plate 3 of optically transmissible material nor production of any cracks therein, thus obtaining a reflection plate of optically transmissible material having a highly precise size for semiconductor heat treatment.

As explained in the foregoing, the reflection plate for semiconductor heat treatment according to the present invention will control the adhesion of foreign materials, the production of reaction gases to prevent the plate of optically transmissible material is made free from deformation thereof or formation of cracks therein.

Further, the method of manufacturing a reflection plate for semiconductor heat treatment according to the present invention ensures that moisture adsorbed onto the plate of inorganic material, residual gases or ambient gases within the plate of optically transmissible material are effectively discharged such that a reflection plate having a highly precise size is obtained for semiconductor heat treatment.

What is claimed is:

1. A reflection plate for semiconductor heat treatment, which comprises a disk-shaped or ring-shaped plate of optically transmissible material and a plate of inorganic material hermetically enclosed in said disk-shaped or ring-shaped plate;

wherein said plate of inorganic material has at least one side in contact with said plate of optically transmittable material, said at least one side having a surface roughness of Ra 0.1 to 10.0 µm, said at least one side being formed with grooves therein.

2. A reflection plate for semiconductor heat treatment as set forth in claim 1, wherein both of said plate of optically transmissible material and said plate of inorganic material are ring-shaped, said grooves formed in said plate of inorganic material including grooves extending linearly and continuously from the inner periphery to the outer periphery thereof.

3. A reflection plate for semiconductor heat treatment as set forth in claim 1, wherein both of said plate of optically transmissible material and said plate of inorganic material are disk-shaped, said grooves formed in said plate of inorganic material including grooves extending linearly and continuously from one outer periphery to another outer periphery opposite said one outer periphery thereof.

4. A reflection plate for semiconductor heat treatment as set forth in claim 3, wherein said grooves formed in the plate of inorganic material are extending centrally thereof.

5. A reflection plate for semiconductor heat treatment as set forth in claim 1, wherein said grooves formed in the plate of inorganic material include one or a plurality of concentrically extending ones.

6. A reflection plate for semiconductor heat treatment as set forth in claim 5, wherein said plate of inorganic material having a surface is defined by said grooves formed therein in a substantially uniformly divided manner.

7. A reflection plate for semiconductor heat treatment as set forth in claim 6, wherein the inside pressure of said plate of optically transmissible material hermetically enclosing said plate of inorganic material is reduced down to 200 torr or less.

8. A reflection plate for semiconductor heat treatment as set forth in claim 1, wherein said plate of inorganic material has at least one hole bored in the direction of thickness thereof at a position where said grooves intersect each other.

9. A reflection plate for semiconductor heat treatment as set forth in claim 6, wherein said plate of inorganic material has at least one hole bored in the direction of thickness thereof at a position where said grooves intersect each other.

10. A reflection plate for semiconductor heat treatment as set forth in claim 8, wherein said at least one hole is centrally formed in said plate of inorganic material.

11. A reflection plate for semiconductor heat treatment as set forth in claim 1, wherein said grooves formed in said plate of inorganic material have a total length 1 to 10 times the circumferential length of said plate.

12. A reflection plate for semiconductor heat treatment as set forth in claim 8, wherein said grooves formed in said plate of inorganic material have a total length 1 to 10 times the circumferential length of said plate.

13. A reflection plate for semiconductor heat treatment as set forth in claim 9, wherein said grooves formed in said plate of inorganic material have a total length 1 to 10 times the circumferential length of said plate.

14. A method of manufacturing the reflection plate for semiconductor heat treatment as set forth in claim 1 comprising the steps of
providing a first plate member of optically transmissible material with a recess for accommodating a plate of inorganic material having a surface formed with grooves;
forming a gas vent in the floor of said recess;
accommodating said plate of inorganic material in said recess such that said surface formed with grooves is brought into contact with the floor of said recess before covering said recess with a second plate member of optically transmissible material;
discharging ambient gases within the recess by way of the gas vent while the first plate member and the second plate member are subjected to fusion treatment to each other at a temperature of 1200° C. or higher; and
closing said gas vent after the fusion treatment.

15. A method of manufacturing the reflection plate for semiconductor heat treatment comprising the steps of
providing a first plate member of optically transmissible material with a recess for accommodating a plate of inorganic material having a surface formed with grooves;
forming a gas vent in the floor of said recess;
accommodating said plate of inorganic material in said recess such that said surface formed with grooves is brought into contact with the floor of said recess before covering said recess with a second plate member of optically transmissible material;
discharging ambient gases within the recess by way of the gas vent while the first plate member and the second plate member are subjected to fusion treatment to each other at a temperature of 1200° C. or higher; and
closing said gas vent after the fusion treatment.

16. A reflection plate for semiconductor heat treatment, which comprises a disk-shaped or ring-shaped plate of optically transmissible material and a plate of inorganic material hermetically enclosed in said disk-shaped or ring-shaped plate;
wherein said plate of inorganic material has at least one side in contact with said plate of optically transmittable material, said at least one side having a surface roughness of Ra 0.1 to 10.0 μm, said plate of optically transmittable material in contact with said plate of inorganic material having at least one side formed with grooves therein.

17. A reflection plate for semiconductor heat treatment as set forth in claim 16, wherein both said plate of optically transmissible material and said plate of inorganic material are ring-shaped, said plate of optically transmissible material having fusing surfaces at inner and outer peripheries thereof, said grooves including grooves extending linearly and continuously from the fusing surface of said inner periphery to the fusing surface of said outer periphery.

18. A reflection plate for semiconductor heat treatment as set forth in claim 16, wherein both said plate of optically transmissible material and said plate of inorganic material are disk-shaped, said plate of optically transmissible material having a fusing surface at an outer periphery thereof, said grooves including grooves extending linearly and continuously from the fusing surface of one outer periphery to the fusing surface of another outer periphery opposite said one outer periphery.

* * * * *